United States Patent
Izumi et al.

(10) Patent No.: US 6,262,408 B1
(45) Date of Patent: Jul. 17, 2001

(54) TWO-DIMENSIONAL IMAGE DETECTOR AND PROCESS FOR MANUFACTURING THE SAME

(75) Inventors: Yoshihiro Izumi, Kashihara; Osamu Teranuma, Tenri; Tokihiko Shinomiya, Nara; Toshiyuki Sato, Kyoto; Satoshi Tokuda, Kusatsu, all of (JP)

(73) Assignees: Sharp Kabushiki Kaisha, Osaka; Shimadzu Corporation, Kyoto, both of (JP)

( * ) Notice: Subject to any disclaimer, the term of this patent is extended or adjusted under 35 U.S.C. 154(b) by 0 days.

(21) Appl. No.: 09/229,269

(22) Filed: Jan. 13, 1999

(30) Foreign Application Priority Data

Jan. 20, 1998 (JP) .................................. 10-009067
May 15, 1998 (JP) .................................. 10-133986

(51) Int. Cl.⁷ .................................................. H01L 27/00
(52) U.S. Cl. ............................... 250/208.1; 250/370.01; 250/370.12
(58) Field of Search .................. 250/208.1, 370.01, 250/370.08, 370.09, 370.12, 370.13

(56) References Cited

U.S. PATENT DOCUMENTS

| | | |
|---|---|---|
| 5,379,336 | 1/1995 | Kramer et al. . |
| 5,420,452 * | 5/1995 | Tran et al. .......................... 257/428 |
| 5,463,216 * | 10/1995 | Van Berkel ........................ 250/208.1 |
| 5,723,866 * | 3/1998 | Hamilton ......................... 250/370.09 |
| 6,035,013 * | 3/2000 | Orava et al. ........................ 378/37 |

FOREIGN PATENT DOCUMENTS

| | | |
|---|---|---|
| 0 523 783 A | 1/1993 | (EP) . |
| 0 602 475 A | 6/1994 | (EP) . |
| 0 783 177 A | 7/1997 | (EP) . |

OTHER PUBLICATIONS

Japanese KOKAI (Published unexamined patent application) No. 342098/1994 (Tokukaihei 6–342098, Published Dec. 13, 1994)—with partial translation.
"A New Digital Detector for Projection Radiography", Lee et al, 1995, SPIE, vol. 2432, pp. 237–249.
"Application of a–Si Active Matrix Technology in a X–Ray Detector Panel", Jeromine et al, SID 97 DIGEST, May 13–15, 1997, pp. 91–94.

* cited by examiner

Primary Examiner—Georgia Epps
Assistant Examiner—Timothy J Thompson
(74) Attorney, Agent, or Firm—Nixon & Vanderhye P.C.

(57) ABSTRACT

A two-dimensional image detector of the present invention includes: an active matrix substrate equipped with charge storage capacitors and TFTs; and an opposing substrate equipped with a semiconductor substrate. The two-dimensional image detector is formed by adhering the active matrix substrate and the opposing substrate to each other with an anisotropic conductive adhesive agent. With this structure, since a semiconductor layer is not required to be deposited on the active matrix substrate where the TFTs are already formed, it is possible to use CdTe, CdZnTe, etc. The use of CdTe, CdZnTe, etc. as a material of the semiconductor layer having photoconductivity allows the two-dimensional image detector to show good response and to deal with the dynamic images.

59 Claims, 9 Drawing Sheets

FIG. 4 (a)
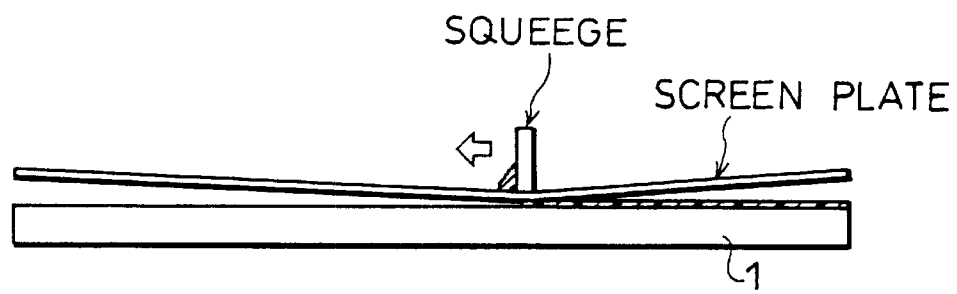
FIG.4(b)　　FIG.4(c)　　FIG.4(d)
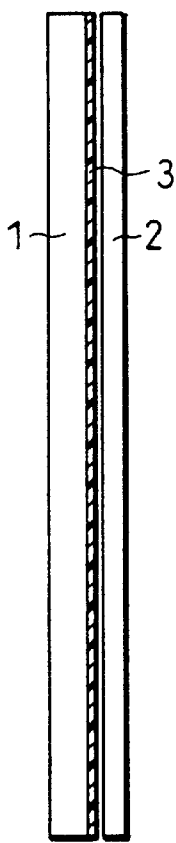 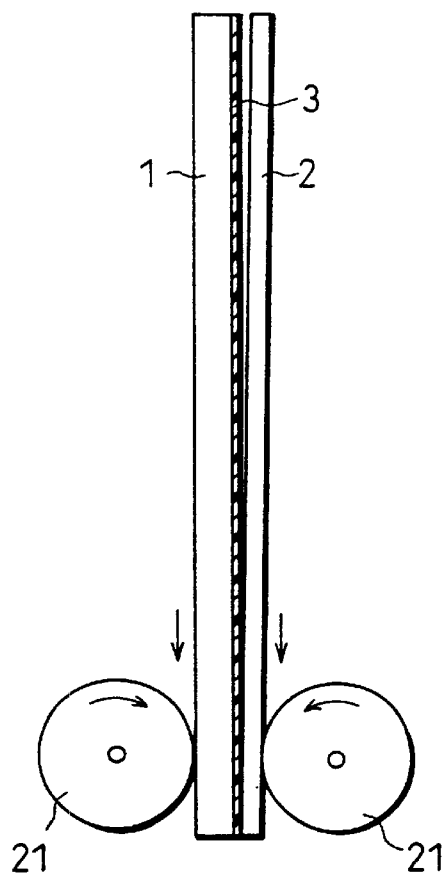 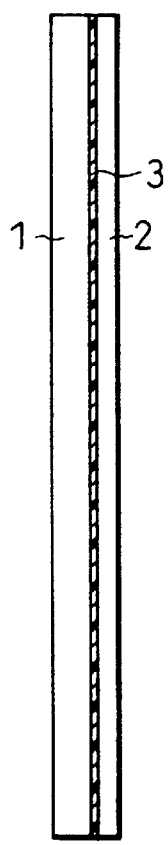

TWO-DIMENSIONAL IMAGE DETECTOR AND PROCESS FOR MANUFACTURING THE SAME

FIELD OF THE INVENTION

The present invention relates to a two-dimensional image detector for detecting an image by radiation such as X-rays, visible light, infrared light, etc., and a process for manufacturing such a two-dimensional image detector.

BACKGROUND OF THE INVENTION

A device conventionally known as a two-dimensional image detector for detecting an image by radiation has such a structure that semiconductor sensors for sensing X-rays to generate charges (electrons-holes) are two-dimensionally disposed, and electric switches are provided for the respective sensors so as to read out the charges of the sensors column by column by sequentially turning on the electric switches row by row. The specific structure and the principle of the two-dimensional image detector are described in, for example, references: D. L. Lee, et al., "A New Digital Detector for Projection Radiography", SPIE, 2432, pp. 237–249, 1995; and L. S. Jeromin, et al., "Application of a-Si Active-Matrix Technology in a X-Ray Detector Panel", SID 97 DIGEST, pp. 91–94, 1997; and Japanese Publication of Unexamined Patent Application No. 342098/1994 (Tokukaihei 6-342098).

The following descriptions will explain the structure and principle of the conventional two-dimensional radiation image detector mentioned above. FIG. 8 is a depiction of the structure of the two-dimensional radiation image detector. FIG. 9 is a depiction of the cross section showing the structure of each pixel of the two-dimensional radiation image detector.

As shown in FIGS. 8 and 9, the two-dimensional radiation image detector includes an active matrix substrate having a glass substrate 51 on which XY matrix-form electrode wiring (gate electrodes 52 and source electrodes 53), TFTs (thin film transistors) 54, and charge storage capacitors (Cs) 55, etc. are formed. On the almost entire surface of the active matrix substrate, a photoconductive film 56, a dielectric layer 57, and a top electrode 58 are formed.

The charge storage capacitor 55 includes a Cs electrode 59 and a pixel electrode 60 connected to a drain electrode of the TFT 54, arranged so that the Cs electrode 59 faces the pixel electrode 60 through an insulating film 61.

The photoconductive film 56 is formed by a semiconductor material for generating charges on exposure to radiation such as X-rays. According to the above references, amorphous selenium (a-Se) having a high dark resistance and showing satisfactory photoconduction characteristics on exposure to X-ray irradiation is used. The photoconductive film 56 is formed by a vacuum evaporation method to have a thickness ranging from 300 to 600 $\mu$m.

As the above-mentioned active matrix substrate, an active matrix substrate formed in the process of manufacturing a liquid crystal display device can be utilized. For example, an active matrix substrate used for an active-matrix type liquid crystal display device (AMLCD) includes TFTs formed by amorphous silicon (a-Si) or poly-silicon (p-Si), XY matrix electrodes, and charge storage capacitors. Therefore, by only slightly changing the design, the active matrix substrate formed in the process of manufacturing the liquid crystal display device can be easily utilized as the active matrix substrate for use in the two-dimensional radiation image detector.

Next, the following descriptions will explain the operational principle of the two-dimensional radiation image detector having the above-mentioned structure.

When the photoconductive film 56 is exposed to radiation, charges are generated in the photoconductive film 56. As shown in FIGS. 8 and 9, since the photoconductive film 56 and the charge storage capacitor 55 are electrically connected in series, when a voltage is applied across the top electrode 58 and the Cs electrode 59, the negative and positive charges generated in the photoconductive film 56 move toward the anode side and the cathode side, respectively. As a result, the charges are accumulated in the charge storage capacitor 55. Note that a charge blocking layer 62 as a thin insulating layer is formed between the photoconductive film 56 and the charge storage capacitor 55, and functions as a blocking-type photodiode for blocking the flow of the charges from one side.

With this function, the charges accumulated in the charge storage capacitors 55 can be taken out via source electrodes S1, S2, S3, . . . , Sn by setting the TFTs 54 to the open state in accordance with input signals of gate electrodes G1, G2, G3, . . . , Gn. Since the gate electrodes 52, the source electrodes 53, the TFTs 54, the charge storage capacitors 55, etc. are all provided in the XY-matrix form, X-ray image information can be obtained two-dimensionally by sequentially scanning the signals inputted to the gate electrodes G1, G2, G3, . . . , Gn line by line.

If the photoconductive film 56 used in the above two-dimensional image detector shows photoconductivity with respect to visible light and infrared light as well as radiation such as X-rays, the two-dimensional image detector also functions as a two-dimensional image detector for detecting an image by visible light and infrared light.

However, in the above conventional structure, a-Se is used as the photoconductive film 56. The response of a-Se is not good because the photocurrent produced by a-Se has distributed conduction characteristics typical of amorphous materials. Further, since the sensitivity (S/N ratio) of a-Se to X-rays is not sufficient, information cannot be read out until the charge storage capacitors 55 are fully charged by long-time irradiation with X-rays.

In addition, the dielectric layer 57 is provided between the photoconductive film 56 and the top electrode 58 for reduction of the leakage current (dark current) and protection from the high voltage. Since the charges remain in the dielectric layer 57, a sequence for removing the remaining charges every frame must be added, thereby causing such a problem that the two-dimensional image detector can be utilized for only shooting static images.

Meanwhile, in order to obtain image data corresponding to dynamic images, it is necessary to use the photoconductive film 56 made of a crystalline (or polycrystalline) photoconductive material having excellent sensitivity (S/N ratio) to X-rays in place of a-Se. When the sensitivity of the photoconductive film 56 is improved, the charge storage capacitors 55 can be sufficiently charged even by short-time irradiation with X-rays, and the application of a high voltage to the photoconductive film 56 becomes unnecessary, thereby eliminating the need for providing the dielectric layer 57. As a result, adding the sequence for removing the remaining charges every frame is not required, thereby making it possible to shoot dynamic images.

Photoconductive materials known to have excellent sensitivity to X-rays are CdTe, CdZnTe, etc. In general, X-ray photoelectric absorption of a material is proportional to the fifth power of the effective atomic number of the absorbing material. For example, provided that the atomic number of Se is 34 and the effective atomic number of CdTe is 50, about 6.9-times improvement in sensitivity can be expected. However, when using CdTe or CdZnTe as the photoconductive film 56 of the two-dimensional radiation image detector instead of a-Se, the following problem arises.

In the conventional case of using a-Se, the vacuum evaporation method can be employed as the method for depositing the film, and the film can be deposited at room temperatures. Thus, the film deposition on the active matrix substrate was easy. Meanwhile, in the case of using CdTe and CdZnTe, the MBE method and the MOCVD method are known as methods for depositing the film, and particularly, the MOCVD method is suitable, considering deposition of the film over the large-area substrate.

However, the deposition of CdTe or CdZnTe by the MOCVD method requires a high temperature of about 400° C., because thermal decomposition of organic cadmium (DMCd) as a raw material occurs at about 300° C., and thermal decomposition of organic telluriums (DETe and DiPTe) as raw materials occurs at about 400° C. and 350° C., respectively.

Generally, the above-mentioned TFT 54 formed on the active matrix substrate includes an a-Si film or a p-Si film as a semiconductor layer. These films are deposited at temperatures ranging from about 300 to 350° C. while adding hydrogen ($H_2$), so as to improve their semiconductor characteristics. The TFT 54 formed in this way has a heat resistance up to about 300° C. Accordingly, treating the TFT 54 at temperatures higher than 300° C. causes hydrogen to come out of the a-Si film or the p-Si film, thereby deteriorating the semiconductor characteristics.

Consequently, the film deposition of CdTe or CdZnTe by the MOCVD method on the active matrix substrate was practically difficult in view of the film deposition temperature.

SUMMARY OF THE INVENTION

An object of the present invention is to provide a two-dimensional image detector which has an improved response and is capable of dealing with the dynamic images by using CdTe, CdZnTe, etc. as a material of a semiconductor layer having photoconductivity, and a process for manufacturing such a two-dimensional image detector.

In order to achieve the above object, a two-dimensional image detector in accordance with the present invention is characterized in including:

an active matrix substrate including switching elements and charge storage capacitors having pixel electrodes connected to the switching elements;

an opposing substrate including an electrode layer and a semiconductor layer having photoconductivity, the active matrix substrate and the opposing substrate being disposed so that the charge storage capacitors face the semiconductor layer; and a connection layer, disposed between the substrates, for connecting the substrates to each other.

According to the above structure, the active matrix substrate including the switching elements and the charge storage capacitors and the opposing substrate including the electrode layer and the semiconductor layer are disposed so as to face each other, and connected to each other by the connection layer. Namely, since the semiconductor layer is electrically and physically connected to the charge storage capacitors through the connection layer, it is not required to be disposed directly on the active matrix substrate. Therefore, even a semiconductor material that requires the heat treatment at a temperature higher than the heat resistance temperature of the switching element (temperature the switching element can resist) in the film deposition step can be used for the semiconductor layer.

As a result, irrespective of the heat resistance temperature of the switching element, the semiconductor material having excellent sensitivity to radiation such as X-rays, visible light, and infrared light can be freely chosen and used for the semiconductor layer.

Furthermore, by using the semiconductor material with excellent sensitivity for the semiconductor layer, the time required for storing necessary charges is shortened. Therefore, the voltage applied to the electrode section can be set lower than the conventional value. It is thus possible to omit the dielectric layer which were conventionally provided between the semiconductor layer and the electrode section for protection from the high voltage.

As a result, adding a sequence for removing the charges remaining in the dielectric layer every frame is not required, and detecting the dynamic images is enabled.

Meanwhile, a process for manufacturing a two-dimensional image detector is characterized in including the steps of:

(a) preparing active matrix substrates including switching elements and charge storage capacitors having pixel electrodes;

(b) preparing an opposing substrate including an electrode layer and a semiconductor layer showing photoconductivity; and (c) adhering the active matrix substrate and the opposing substrate to each other with a connection layer having anisotropic conductivity.

According to the above manufacturing process, the active matrix substrate including the switching elements and the charge storage capacitors having the pixel electrodes is prepared first in the step (a), and the opposing substrate including the electrode layer and the semiconductor layer showing photoconductivity is prepared in the step (b). Then, in the step (c), the active matrix substrate is connected to the opposing substrate with the connection layer having anisotropic conductivity. In this manner, the semiconductor layer is formed not on the active matrix substrate but on the opposing substrate, and then electrically and physically connected to the active matrix substrate through the connection layer having anisotropic conductivity. Therefore, the semiconductor layer can be formed by using the material which could not be conventionally used from the viewpoint of the heat resistance temperature of the switching element, i.e., the semiconductor material which requires the heat treatment at a high temperature in the film deposition step.

As a result, the semiconductor material having excellent sensitivity to radiation such as X-rays and light such as visible light and infrared light can be freely chosen and used for the semiconductor layer.

Furthermore, by using the semiconductor material with excellent sensitivity for the semiconductor layer, the time required for storing necessary charges is shortened. Therefore, the voltage applied to the electrode section can be set lower than the conventional value. It is thus possible to omit the dielectric layer which were conventionally provided between the semiconductor layer and the electrode section for protection from the high voltage.

As a result, adding a sequence for removing the charges remaining in the dielectric layer every one frame is not required, and detecting the dynamic images is enabled.

For a fuller understanding of the nature and advantages of the invention, reference should be made to the ensuing detailed description taken in conjunction with the accompanying drawings.

BRIEF DESCRIPTION OF THE DRAWINGS

FIGS. 4(a) to 4(d) are explanatory views showing the process of adhering an active matrix substrate and an opposing substrate in the two-dimensional image detector.

DESCRIPTION OF THE PREFERRED EMBODIMENTS

Referring to FIGS. 1 to 7, the following descriptions will explain embodiments of the present invention.

Embodiment 1

Figure 1:
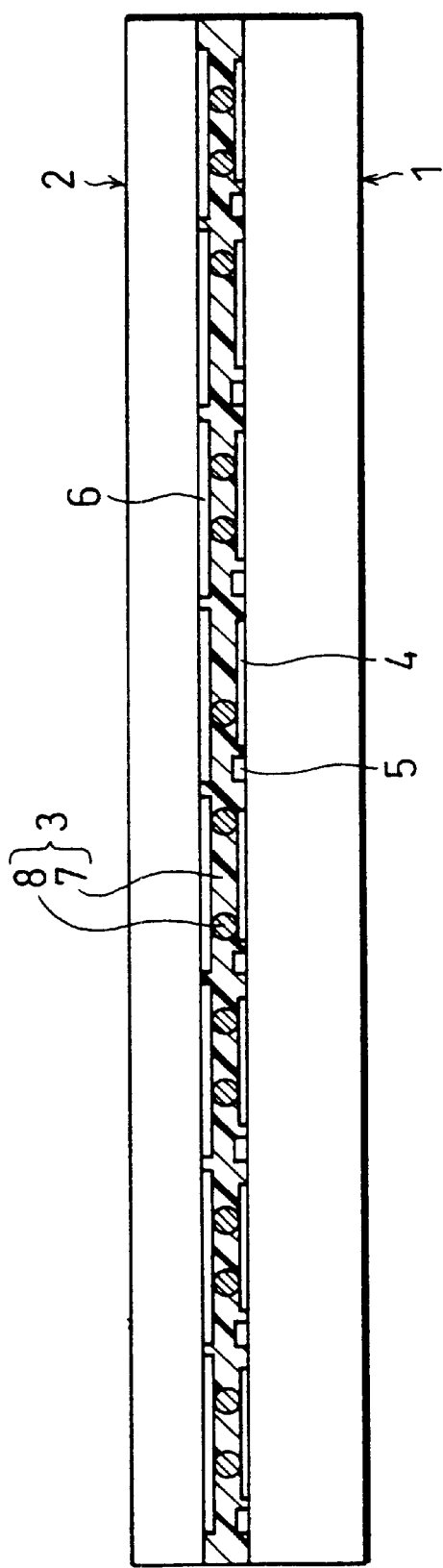
FIG. 1 is a sectional view schematically showing an entire structure of a two-dimensional image detector according to one embodiment of the present invention.

As shown in FIG. 1, a two-dimensional image detector in accordance with the present embodiment includes an active matrix substrate 1 on which charge storage capacitors (Cs) 4 and TFTs (thin film transistors) 5 as switching elements are formed, and an opposing substrate 2 on which connection electrodes 6 are formed. The active matrix substrate 1 and the opposing substrate 2 are adhered to each other by an anisotropic conductive adhesive agent 3 as an anisotropic conductive material. Here, the "anisotropic conductive material" is a generic name of materials whose conduction characteristics have anisotropy. The anisotropic conductive adhesive agent 3 according to this embodiment is produced by mixing conductive particles 8 with an insulating adhesive agent 7.

Next, the detailed structure of each pixel of the two-dimensional image detector will be explained with reference to FIG. 2.

First, the active matrix substrate 1 includes a glass substrate 9 on which XY matrix-form electrode wiring formed by gate electrodes 10 and source electrodes 11, the charge storage capacitors 4, the TFTs 5, etc. are formed. Namely, the electrode wiring, the charge storage capacitors 4, and the TFTs 5 constitute a pixel array layer.

The glass substrate 9 is a no-alkali glass substrate (for example, #7059 or #1737 manufactured by Corning Inc.) on which the gate electrode 10 made of a film of metals such as Ta is formed. The gate electrode 10 is obtained by depositing a film of Ta, etc. to have a thickness of about 3000 Å by sputter evaporation, and then patterning the film to have a desired pattern. At the same time, a Cs electrode 12 of the charge storage capacitor 4 is formed. Next, an insulating film 13 made of $SiN_x$ or $SiO_x$ is deposited to have a thickness of about 3500 Å by the CVD method. The insulating film 13 functions as a gate insulating film of the TFT 5 and as a dielectric layer between the electrodes of the charge storage capacitor 4. As the insulating film 13, an anodic oxidation coating produced by anodic oxidation of the gate electrode 10 and the Cs electrode 12 may be used in combination with $SiN_x$ or $SiO_x$.

Then, an a-Si film (i layer) 14 as a channel section of the TFT 5 and an a-Si film ($n^+$ layer) 15 for bringing source and drain electrodes into contact with each other are deposited by the CVD method to have thicknesses of about 1000 Å and 400 Å, respectively, and the films are patterned to have desired patterns. Thereafter, the source electrode 11 and the drain electrode (also functioning as a pixel electrode 16), made of a metal film of Ta, Al, etc., are formed. The source electrode 11 and the pixel electrode 16 are obtained by depositing the metal films to have a thickness of about 3000 Å by sputter evaporation, and patterning them to have desired patterns.

Then, an insulating protective film 17 is formed so as to insulate and protect the area except for the opening section of the pixel electrode 16. The insulating protective film 17 is obtained by depositing an insulating film made of $SiN_x$ or $SiO_x$ by the CVD method to have a thickness of about 3000 Å, and patterning it to have a desired pattern. As the insulating protective film 17, organic films made of acrylic, polyimide, etc. can be used in place of the insulating films made of inorganic materials. In this manner, the active matrix substrate 1 is formed.

Note that the TFT 5 having an anti-staggered structure including a-Si is used as the TFT element of the active matrix substrate 1, but the TFT element is not limited to this structure. Namely, p-Si or a staggered structure is also acceptable. In addition, the active matrix substrate 1 can be formed by the same process as that of the active matrix substrate formed in the process of manufacturing the liquid crystal display device.

The opposing substrate 2 includes as a support substrate a semiconductor substrate (semiconductor layer) 18 having photoconductivity with respect to radiation such as X-rays. In this case, a compound semiconductor such as CdTe or CdZnTe is used in the semiconductor substrate 18. The thickness of the semiconductor substrate 18 is about 0.5 mm. The semiconductor substrate 18 is a substrate made of a crystal, and easily formed by the Bridgeman method, the gradient freezing method, the travel heating method, etc. On one surface of the semiconductor substrate 18, particularly on the almost entire surface, a top electrode (electrode section) 19 is formed by an X-ray permeable metal such as Al. On the other surface of the semiconductor substrate 18, a charge blocking layer 20 is formed on the almost entire surface, and then the connection electrode 6 is formed. The charge blocking layer 20 is an insulating layer made of $AlO_x$, and has a thickness of about 300 Å. The connection electrode 6 is formed by depositing a metal film such as Ta and Al by sputter evaporation to have a thickness of about 2000 Å, and patterning it to have a desired pattern. The connection electrode 6 is formed at the position corresponding to the pixel electrode 16 formed on the active matrix substrate 1.

The two-dimensional image detector according to the present embodiment is formed by disposing the active matrix substrate 1 and the opposing substrate 2 obtained by the above process so that each of the pixel electrodes 16 faces the connection electrode 6, filling the space therebetween with the anisotropic conductive material, and adhering the two substrates by pressure. The anisotropic conductive adhesive agent 3 is used as the anisotropic conductive material, which is produced by dispersing the conductive particles 8 made of metal particles, etc. into the insulating adhesive agent 7 such as an epoxy thermosetting-type adhesive agent in the form of paste, etc. As the anisotropic conductive adhesive agent 3, the agent whose setting is facilitated by a heat treatment at about 160° C. is used.

Figure 2:
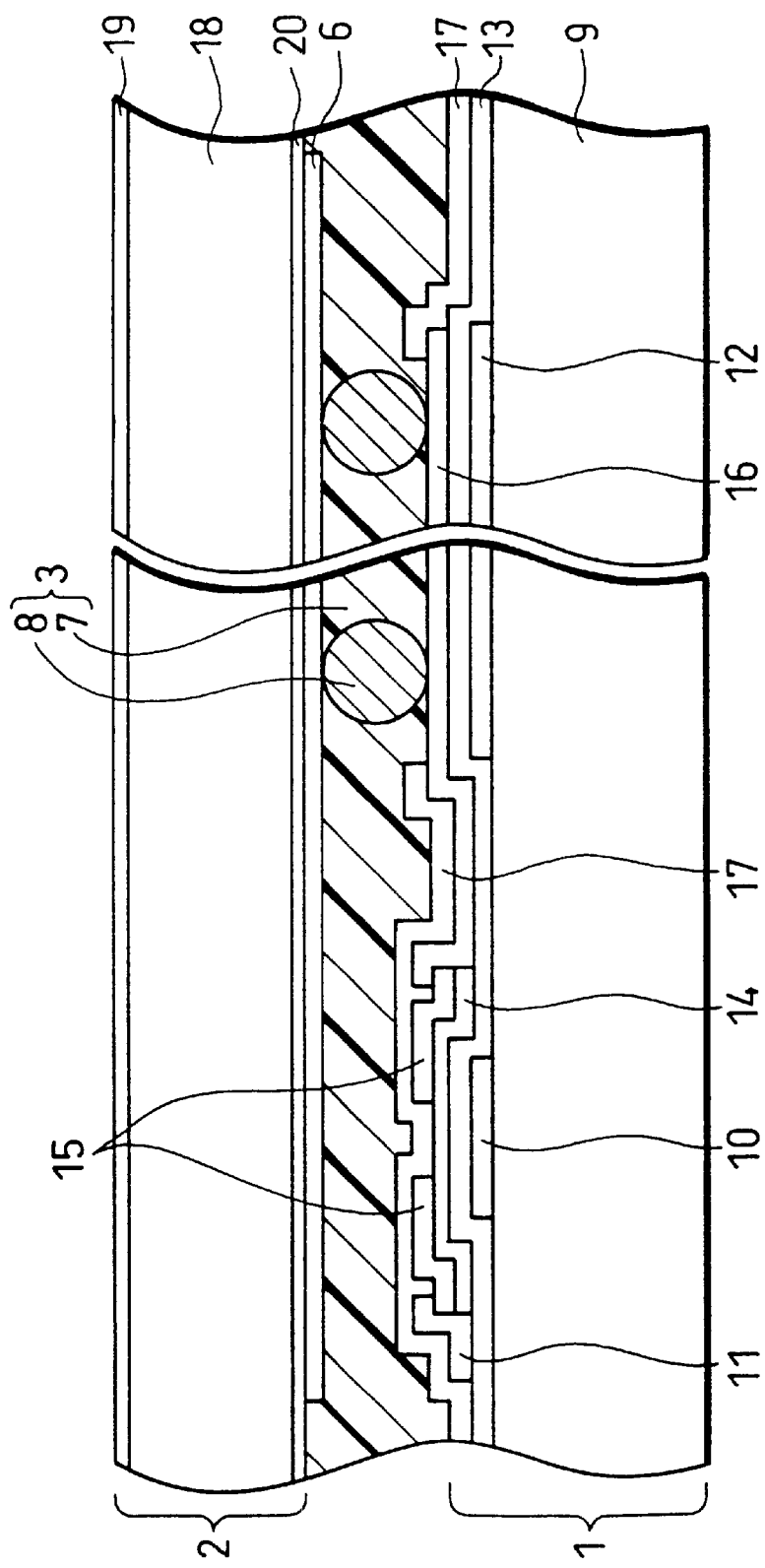
FIG. 2 is a sectional view showing the structure of each pixel of the two-dimensional image detector.
Figure 3:
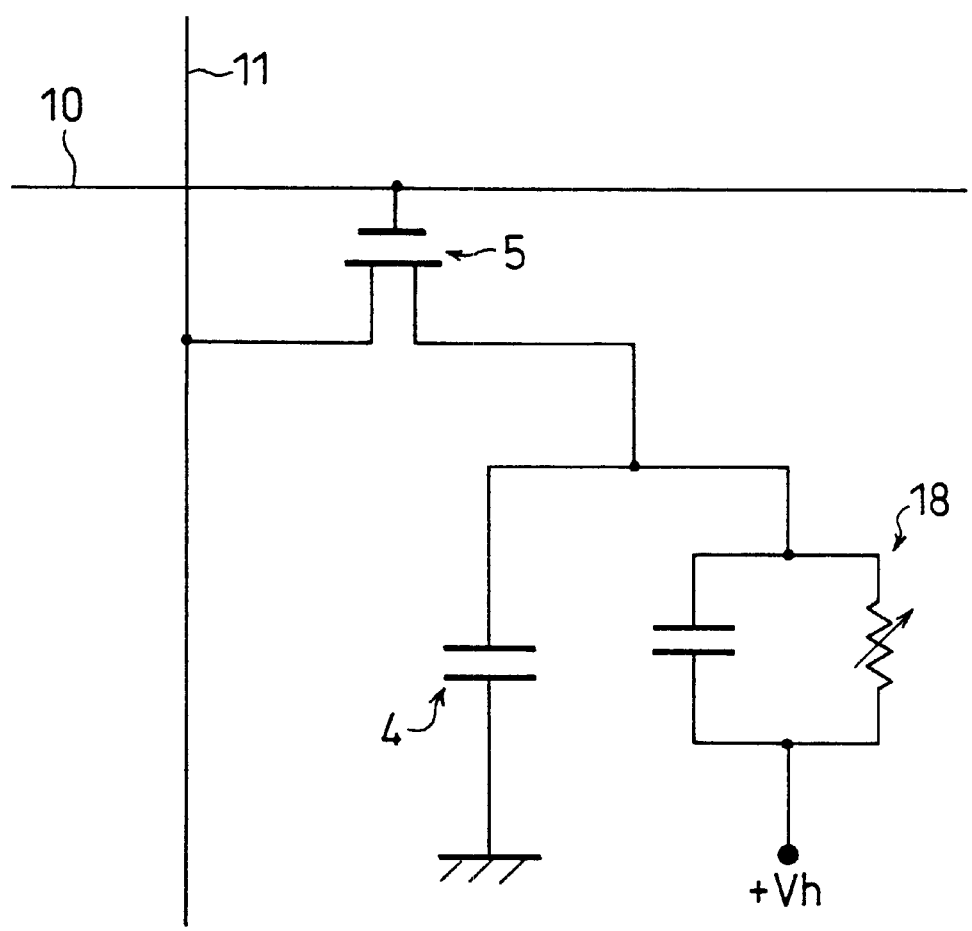
FIG. 3 is a circuit diagram showing an equivalent circuit of each pixel of the two-dimensional image detector.

An equivalent circuit diagram of each pixel of the two-dimensional image detector is shown in FIG. 3. With reference to FIGS. 2 and 3, the operational principle of the two-dimensional image detector will be explained below. When the semiconductor substrate 18 made of CdTe or CdZnTe is exposed to X-rays, charges (electrons-holes) are generated in the semiconductor substrate 18 by the effect of photoconductivity. In this case, the charge storage capacitor 4 and the semiconductor substrate 18 are connected in series via the pixel electrode 16, the anisotropic conductive adhesive agent 3, and the connection electrode 6. Therefore, when a voltage is applied across the top electrode 19 and the Cs electrode 12, the negative and positive charges generated in the semiconductor substrate 18 move toward the anode side and the cathode side, respectively. As a result, the charges are accumulated in the charge storage capacitor 4.

The charge blocking layer 20 as a thin insulating layer is formed between the semiconductor substrate 18 and the connection electrode 6, and functions as a blocking-type photodiode having a MIS (Metal-Insulator-Semiconductor) structure for blocking the injection of charges from one side. This function contributes to the reduction of the dark current generated when no X-rays come into the semiconductor substrate 18. Namely, when a positive voltage is applied to the top electrode 19, the charge blocking layer 20 blocks the injection of electrons from the connection electrode 6 to the semiconductor substrate 18. In some cases, a charge blocking layer is also provided between the semiconductor substrate 18 and the top electrode 19 so as to block the injection of holes from the top electrode 19 to the semiconductor substrate 18, thereby further reducing the dark current.

Needless to say, other than the above-mentioned MIS structure, a heterojunction structure using a lamination film of CdTe/CdS, etc., a PIN junction structure, and a Schottky junction structure are also acceptable as the structure of the blocking-type photodiode, i.e., the structure of the charge blocking layer 20.

Figure 8:
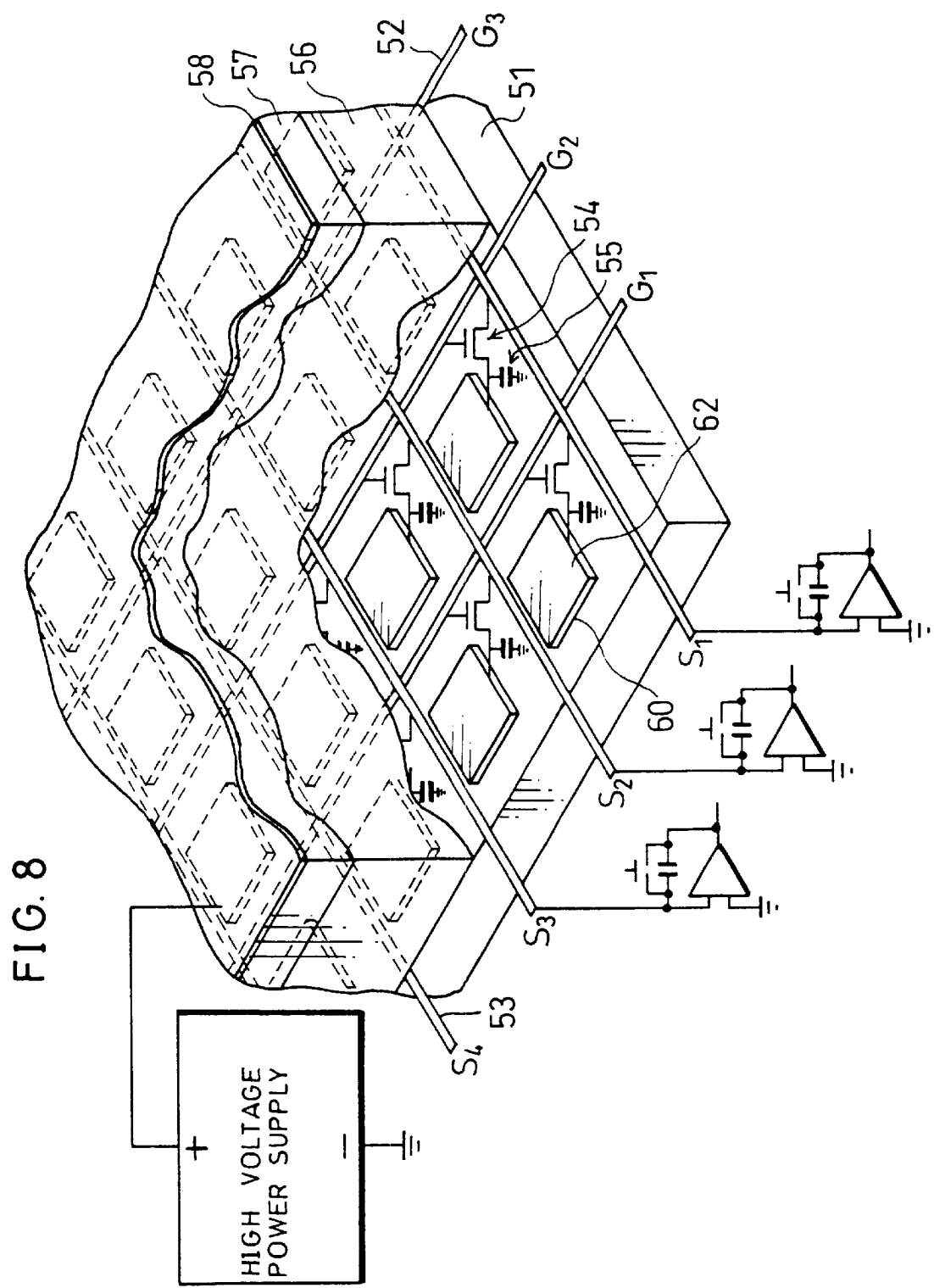
FIG. 8 is a perspective view showing the structure of a conventional two-dimensional image detector.
Figure 9:
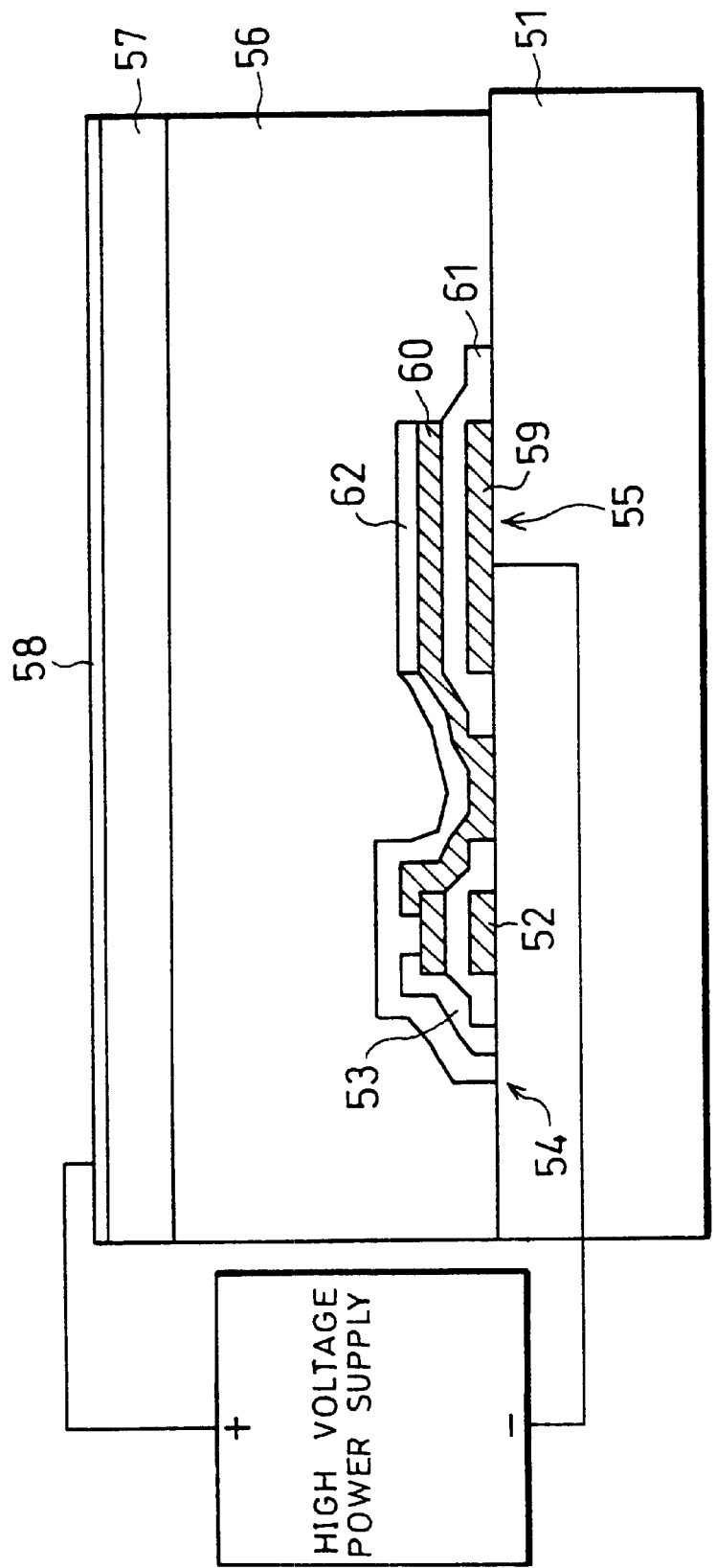
FIG. 9 is a sectional view showing the structure of each pixel of the conventional two-dimensional image detector.

As described above, the charges accumulated in the charge storage capacitor 4 can be taken out of the source electrode 11 by setting the TFT 5 to be in the open state by the input signal of the gate electrode 10. Here, the electrode wiring (the gate electrodes 10 and the source electrodes 11), the TFTs 5, the charge storage capacitors 4, and other members are all arranged in the XY-matrix form like the conventional example shown in FIG. 8. Therefore, X-ray image information can be two-dimensionally obtained by sequentially scanning the signals input to the gate electrodes G1, G2, G3, . . . , Gn line by line. As described so far, the basic operational principle of the two-dimensional image detector of the present embodiment is the same as that of the image detector shown as the conventional example.

As mentioned above, in the two-dimensional image detector in accordance with this embodiment, the active matrix substrate 1 and the opposing substrate 2 are electrically and physically adhered to each other by the anisotropic conductive adhesive agent 3 produced by dispersing the conductive particles 8 into the adhesive agent 7. The active matrix substrate 1 is equipped with the lattice-form electrode wiring, and a plurality of TFTs 5 and pixel electrodes 16, provided at the respective lattice points. The opposing substrate 2 is equipped with the semiconductor substrate 18 having photoconductivity, formed on the almost entire surface of the opposing substrate 2. Therefore, with this arrangement of the present embodiment, the restriction on the film deposition temperature of the photoconductor due to the heat resistance of the active matrix substrate becomes less severe, which has been a problem in the case of directly depositing the photoconductive semiconductor on the active matrix substrate as in the conventional two-dimensional image detector. As a result, it is made possible to use the semiconductor materials (for example, CdTe and CdZnTe) in the two-dimensional image detector, which could not be conventionally deposited on the active matrix substrate directly.

In this case, due to the heat resistance of the active matrix substrate, the temperature required for causing the thermosetting-type anisotropic conductive adhesive agent to set is restricted. However, since the active matrix substrate usually has a heat resistance up to about 250° C., an adhesive agent whose setting proceeds under such a temperature can be easily chosen, thereby causing no trouble in using CdTe or CdZnTe as the semiconductor material.

Since CdTe or CdZnTe can be used as the semiconductor substrate 18 for the above-described reasons, sensitivity to X-rays is improved compared with the conventional two-dimensional image detector using a-Se, and the dielectric layer is not required to be provided between the semiconductor substrate 18 and the top electrode 19. It is thus possible to obtain image data corresponding to dynamic images, i.e., to obtain image data at a rate of 33 msec/frame.

Furthermore, in the two-dimensional image detector of the present embodiment, the connection electrodes 6 are formed on the side of the semiconductor substrate 18, which side faces the active matrix substrate 1, so that the connection electrodes 6 are separately provided for the respective pixels in correspondence with a plurality of pixel electrodes 16 formed on the active matrix substrate 1. Therefore, the pixels on the semiconductor substrate 18 of the opposing substrate 2 are electrically separated from each other. As a result, the charges generated in the semiconductor substrate 18 by incidence of radiation or a light beam are collected on only the connection electrode 6 corresponding to the incidence location, thereby limiting the electric crosstalk caused by the charges moving to the surrounding pixels.

Furthermore, as shown in FIG. 2, the connection electrode 6 having a maximum size within each pixel is formed on the semiconductor substrate 18, and the area of the pixel electrode 16 is set to be less than that of the connection electrode 6 in each pixel. This arrangement enables efficient collection of the charges generated in the semiconductor by incidence of X-rays and light beams, and limits the electric crosstalk between the adjacent pixels even when the active matrix substrate 1 and the opposing substrate 2 are not accurately placed in the correct positions in adhering the two substrates.

In the present embodiment, the pixel electrode 16 was arranged to have a substantially square shape whose side length was about 80 $\mu$m, and the connection electrode 6 was arranged to have a substantially square shape whose side length is about 120 $\mu$m. With this arrangement, a margin of ±20 μm was secured in adhering the active matrix substrate 1 and the opposing substrate 2.

Next, the following descriptions will explain in detail the anisotropic conductive adhesive agent 3 used in the present embodiment. Generally, the agent produced by dispersing the conductive particles 8 into the insulating adhesive agent 7 is used as the anisotropic conductive adhesive agent 3. The conductive particle 8 available here includes metal particles such as Ni and Ag or these metal particles plated with Au, a carbon particle, a metal-film coated plastic particle, i.e., a plastic particle plated with Au or Au/Ni, a transparent conductive particle such as ITO, and a conductive particle composite plastic which is produced by mixing Ni particles with polyurethane. In this embodiment, the metal-film coated plastic particle having excellent elasticity was used so as to accommodate variations in thickness of the upper and lower substrates (the active matrix substrate 1 and the opposing substrate 2).

The adhesive agent 7 available here includes adhesive agents of thermosetting type, thermoplastic type, and photo-curing type. The adhesive agent of each type has the following characteristics.

The thermosetting-type adhesive agent is the agent whose setting is facilitated by only applying a heat treatment, and has various kinds such as epoxy resins, acrylic resins, and polyurethane. In particular, the epoxy resins having excellent reliability in their heat resistance and adhesive property can realize a highly-reliable two-dimensional image detector.

The thermoplastic-type adhesive agent has reversibility in setting and softening, and includes various kinds such as SBS (styrene-butadiene-styrene block copolymer), SEBS (styrene-ethylenebutylene-styrene block copolymer), and PVB (polyvinyl butyral). The adhesive agent of this type has such an advantage that, when deficiency is found in either the active matrix substrate 1 or the opposing substrate 2 after the two substrates are once heated and adhered to each other, the adhesive agent 7 can be softened by heating it again, and the two substrates can be easily separated from each other. Namely, this adhesive agent is suitable for performing many rework treatments. Note that a mixed-type adhesive agent in which the thermosetting-type adhesive agent is mixed with the thermoplastic-type adhesive agent is used in some cases.

As the photo-curing-type adhesive agent, acrylic resins are often used. The adhesive agent of this type is the agent whose setting is facilitated by irradiation of light such as ultraviolet rays, and requires no heat treatment. Therefore, when adhering the active matrix substrate 1 and the opposing substrate 2, even if their thermal expansion coefficients are different, warpage of the substrates and separation of adhered surfaces are not caused by the difference in the thermal expansion coefficients. It is thus possible to adhere the substrates having relatively large areas.

For example, the glass substrate #1737 manufactured by Corning Inc. used in the active matrix substrate 1 has the thermal expansion coefficient of $37.8 \times 10^{-7}$ (/° C.), while CdTe has the thermal expansion coefficient of $47 \times 10^{-7}$ (/° C.) which is different from the above value. Therefore, in adhering the two members, using the photo-curing-type adhesive agent requiring no heat treatment is preferable, if possible. In the case of using the photo-curing-type adhesive agent, the Cs electrode 12 and the pixel electrode 16 are preferably formed by transparent electrodes such as ITO. This is because the anisotropic conductive adhesive agent 3 located in the gap between the active matrix substrate 1 and the opposing substrate 2 must be irradiated with light, when the two substrates are kept adhered to each other. By irradiation with light incident from the active matrix substrate 1 through the transparent Cs electrode 12 and pixel electrode 16, setting of the anisotropic conductive adhesive agent 3 can be facilitated.

As described so far, the adhesive agent 7 of the above types to be used for the anisotropic conductive adhesive agent 3 can be selected depending on the uses. In the present embodiment, taking the adhesion strength seriously, the thermosetting-type adhesive agent is used.

There are paste-type and film-type anisotropic conductive adhesive agents 3. The paste-type adhesive agent can be easily applied to a large-area substrate by, for example, the screen printing method. The film-type adhesive agent has excellent uniformity in its thickness, thereby easily achieving a uniform thickness of the adhesive agent even when adhering the large-area substrates. In this embodiment, although either of the types can be used, the paste-type adhesive agent was adopted.

The following descriptions will explain the specific method for adhering the active matrix substrate 1 and the opposing substrate 2 using the paste-type thermosetting-type anisotropic conductive adhesive agent 3.

FIGS. 4(a) to 4(d) show the process of adhering the two substrates to each other. First, as shown in FIG. 4(a), the anisotropic conductive adhesive agent 3 is applied by the screen printing method to the almost entire surface of one of the active matrix substrate 1 and the opposing substrate 2 to have a thickness of about 10 μm, to which surface the other of the two substrates is to be adhered. If the flatness of the adhesive agent 7 after applied is not sufficient, it may be improved by a heat treatment at low temperatures ranging from 50 to 60° C.

Next, as shown in FIG. 4(b), the two substrates are disposed so as to face each other with a slight gap therebetween. In this case, if the warpage of the substrate due to its own weight is large, it is preferred that the two substrates are supported vertically and arranged to face each other as shown in FIG. 4(b).

Then, as shown in FIG. 4(c), the two substrates disposed so as to face each other are adhered to each other by heat and pressure by passing the substrates between heat rollers 21 from one end of the substrates. The heat rollers 21 are made of rubber heated to the setting temperature at which the anisotropic conductive adhesive agent 3 sets (about 160° C. in the present embodiment). In this case, if there is a possibility of causing thermal cracking by abruptly heating the substrates, the two substrates may be preheated before subjected to roller heating, or the two substrates may be gradually heated by using heat rollers of more than two types for heating at low and high temperatures.

In this manner, when the adhesion treatment with heat and pressure is completed by passing the whole substrates between the heat rollers 21, as shown in FIG. 4(d), the active matrix substrate 1 and the opposing substrate 2 are adhered to each other with the anisotropic conductive adhesive agent 3.

In the above adhering process, the anisotropic conductive adhesive agent 3 is applied by the screen printing method. Therefore, application of the adhesive agent is easy even when adhering the active matrix substrate 1 and the opposing substrate 2 having large areas. It is needless to say that printing methods other than the screen printing method, for example, the offset printing method may be used in the step of applying the anisotropic conductive adhesive agent 3. In addition, when using the film-type anisotropic conductive adhesive agent 3 in place of the paste-type anisotropic conductive adhesive agent 3, transferring the film by the laminating method instead of printing is convenient.

In this case, the diameter of the conductive particle 8 contained in the anisotropic conductive adhesive agent 3 is preferably set to be substantially equal to the thickness of the applied adhesive agent 7. This is because the surfaces of the two substrates, where the substrates are adhered to each other, are substantially flat and have no protrusion (bump) formed on the electrodes. Usually, the anisotropic conductive adhesive agent 3 mentioned above is arranged to achieve conductivity between the upper and lower substrates by reducing the clearance between the two substrates to a value equal to or smaller than the diameter of the conductive particles 8 in the pressing step and bringing the two substrates into contact with the conductive particles 8. In this case, the excessive adhesive agent 7 can flow into the gaps where the bumps do not exist.

In contrast, as in the two-dimensional image detector according to this embodiment, when the surfaces where the two substrates are adhered to each other are substantially flat, there are no gaps into which the excessive adhesive agent can flow. Thus, if the thickness of the applied adhesive agent 7 is much larger than the diameter of the conductive particles 8, the excessive adhesive agent 7 makes it difficult to reduce the clearance between the two substrates in the pressing step. In order to prevent such a problem, the diameter of the conductive particle 8 contained in the anisotropic conductive adhesive agent 3 and the thickness of the applied adhesive agent 7 are in advance set to be substantially equal to each other. As a result, the amount of the excessive adhesive agent 7 can be minimized, thereby making it possible to achieve satisfactory anisotropic conductivity.

Strictly speaking, the thickness of the applied adhesive agent 7 is preferably set a little smaller than the diameter of the conductive particle 8, considering the amount of deformation of the conductive particles 8 after the pressing step. In the present embodiment, it was confirmed that a satisfactory result would be obtained by using the conductive particles 8 having a diameter of 10 µm, and setting the thickness of the applied adhesive agent 7 within a range from 9 to 10 µm.

In the above adhering process, the heat treatment using the heat rollers is performed. Consequently, a large-scale hydraulic press device, etc. are not required even when adhering the active matrix substrate 1 and the opposing substrate 2 having large areas, thereby simplifying the adhering step and the devices used for adhesion.

For example, if the anisotropic conductive adhesive agent 3 to be used requires a pressure of 10 kgf/cm², a press force as large as 20000 kgf is required for pressing the whole surfaces of the two substrates having a size of about 40 cm×50 cm against each other by the hydraulic press device. In order to obtain such a large press force, a large-scale press device is necessary. In contrast, when subsequently pressing the substrates of the same size by the heat rollers as described above, the substrates can be adhered to each other by the press force ranging from about 200 to 500 kgf, thereby simplifying the devices.

When the substrates to be adhered have a relatively small area, they can be pressed by a general hydraulic press device and adhered to each other by thermocompression bonding. For example, when the substrates have a size of about 10 cm×10 cm, since a press force of 1000 kgf is enough, a relatively small-scale press device can be used. In this case, a general thermal press device can be used.

When a large press force must be applied to large-area substrates, an autoclave device for pressing the substrates using high pressure can be utilized instead of the hydraulic press device. Since the autoclave device presses the substrates using high pressure of gas (fluid), a uniform pressure can be obtained even when applied to the large-area substrates, and the heat treatment can be performed at the same time.

Embodiment 2

Figure 5:
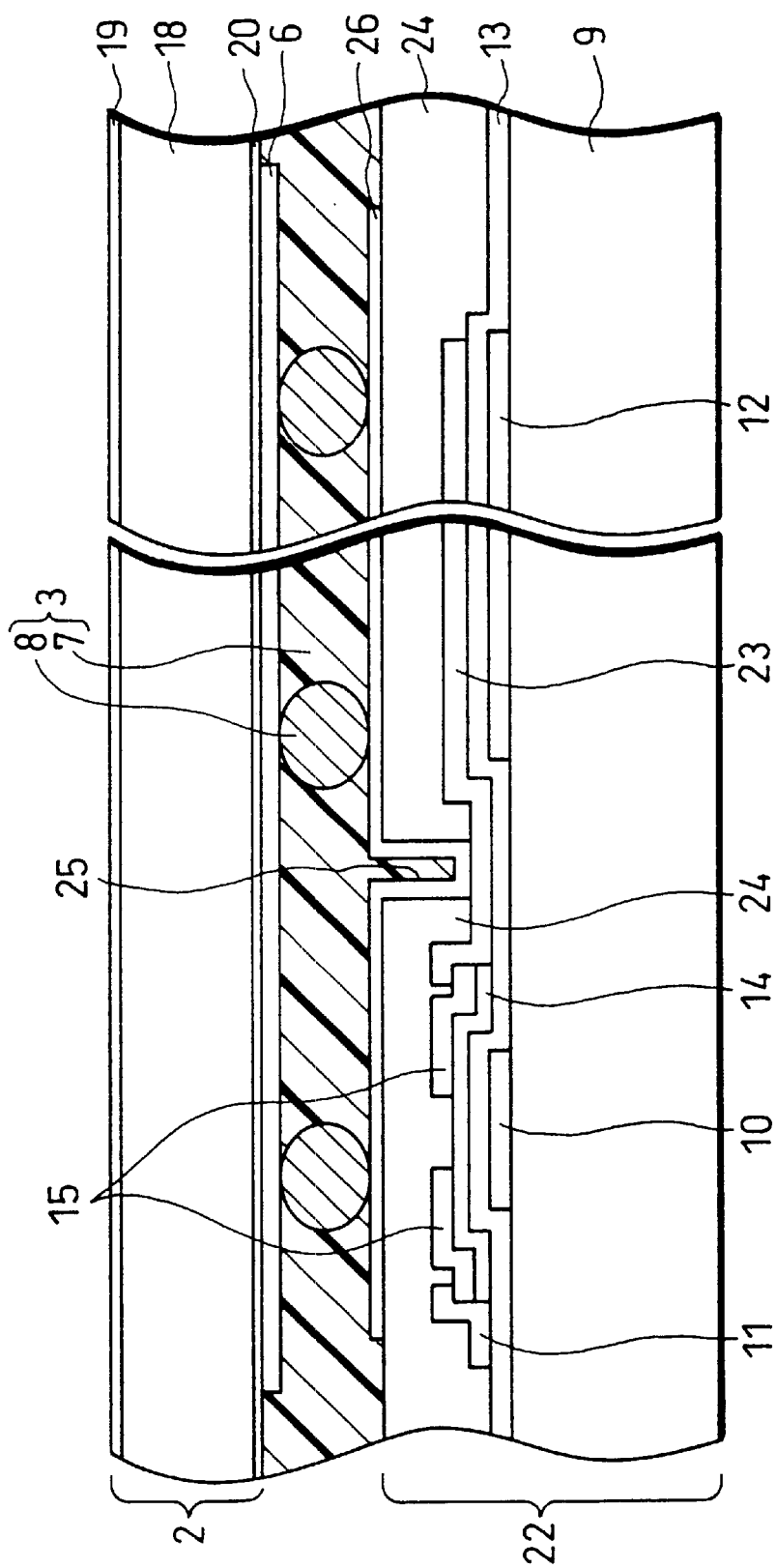
FIG. 5 is a sectional view showing the structure of each pixel of a two-dimensional image detector of another embodiment of the present invention, using an active matrix substrate having a structure different from that of the active matrix substrate shown in FIG. 1.

The active matrix substrate used in the two-dimensional image detector according to the present invention is not limited to the structure shown in FIG. 2, and an active matrix substrate having another structure can be used. FIG. 5 shows the structure of a two-dimensional image detector including an active matrix substrate 22 as another example of the structure of the active matrix substrate. The structure of the active matrix substrate 22 is similar to that of the active matrix substrate 1 shown in FIG. 2. Therefore, the members having the same function as those shown in FIG. 2 will be designated by the same reference numbers, and their descriptions will be omitted.

Like the active matrix substrate 1 according to the first embodiment, the active matrix substrate 22 includes a glass substrate 9 on which XY matrix-form electrode wiring formed by gate electrodes 10 and source electrodes 11, the charge storage capacitors 4, the TFTs 5, etc. are formed.

The glass substrate 9 is a no-alkali glass substrate (for example, #7059 or #1737 manufactured by Corning Inc.) on which the gate electrode 10 made of a metal film of Ta, etc. is formed. The gate electrode 10 is obtained by depositing a film of Ta, etc. to have a thickness of about 3000 Å by sputter evaporation, and then patterning the film to have a desired pattern. At the same time, a Cs electrode 12 of the charge storage capacitor 4 is formed. Next, an insulating film 13 made of $SiN_x$ or $SiO_x$ is deposited to have a thickness of about 3500 Å by the CVD method. The insulating film 13 functions as a gate insulating film of the TFT 5 and as a dielectric layer between the electrodes of the charge storage capacitor 4. Together with $SiN_x$ or $SiO_x$, an anodic oxidation coating produced by anodic oxidation of the gate electrode 10 and the Cs electrode 12 may be used for forming the insulating film 13.

Then, an a-Si film (i layer) 14 functioning as a channel section of the TFT 5 and an a-Si film ($n^+$ layer) 15 for bringing the source electrode 11 and a drain electrode 23 (to be described later) into contact with each other are deposited by the CVD method to have thicknesses of about 1000 Å and 400 Å, respectively, and then patterned to have desired patterns. Thereafter, the source electrode 11 and the drain electrode 23 made of metal films of Ta or Al are formed. The source electrode 11 and the drain electrode 23 are obtained by depositing the metal films to have a thickness of 3000 Å by sputter evaporation, and patterning them to have desired patterns.

Then, the almost entire surface of the active matrix substrate 22 is coated with an insulating protective film 24 having a thickness of about 3 µm. As the insulating protective film 24, an organic insulating film having photosensitivity, for example, an acrylic resin is used. The insulating protective film 24 is then patterned by a photolithography technique, and a throughhole 25 is formed at a specific location. Thereafter, a pixel electrode 26 made of a conductive film such as Al, Ti, and ITO is deposited on the insulating protective film 24 by sputter evaporation to have a thickness of about 2000 Å, and patterned to have a desired pattern. In this case, the pixel electrode 26 and the drain electrode 23 of the TFT 5 are electrically connected through the throughhole 25 provided in the insulating protective film 24.

The two-dimensional image detector according to the present embodiment is completed in the same manner as in the first embodiment. Namely, the active matrix substrate 22 having the above structure is adhered to an opposing substrate 2 including as a support substrate a semiconductor substrate 18 having photoconductivity with respect to X-rays with an anisotropic conductive material 3. This two-dimensional image detector operates on the same basic principle as that described in the first embodiment, though the structures of the active matrix substrates are slightly different.

As mentioned above, the two-dimensional image detector in accordance with the present embodiment includes the active matrix substrate 22 whose surface is substantially entirely covered with the insulating protective film 24 made of an organic insulating film. Therefore, the insulating protective film 24 makes the base substrate (the glass substrate 9 with the XY matrix-form electrode wiring and the TFTs 5 formed thereon) flat. In the structure according to the first embodiment shown in FIG. 2, the surface of the active matrix substrate 1 has projections and depressions of about 1 $\mu$m because of the TFTs 5 and the XY matrix-form electrode wiring. In contrast, in the structure according to the present embodiment, the surface of the base substrate is made flat by the insulating protective film 24 as shown in FIG. 5, thereby reducing the projections and the depressions on the surface of the active matrix substrate 22 to those of about 0.2 $\mu$m.

Therefore, no influence of the substrate surface unevenness is exerted when adhering the active matrix substrate 22 and the opposing substrate 2. As a result, conductive particles 8 can be more surely brought into contact with the upper and lower electrodes.

Furthermore, in the structure according to the second embodiment, the pixel electrode 26 can be formed on the TFT 5 and the electrode wiring in an overlapped manner, thereby securing a large margin in designing the pixel electrode 26.

Embodiment 3

Figure 6:
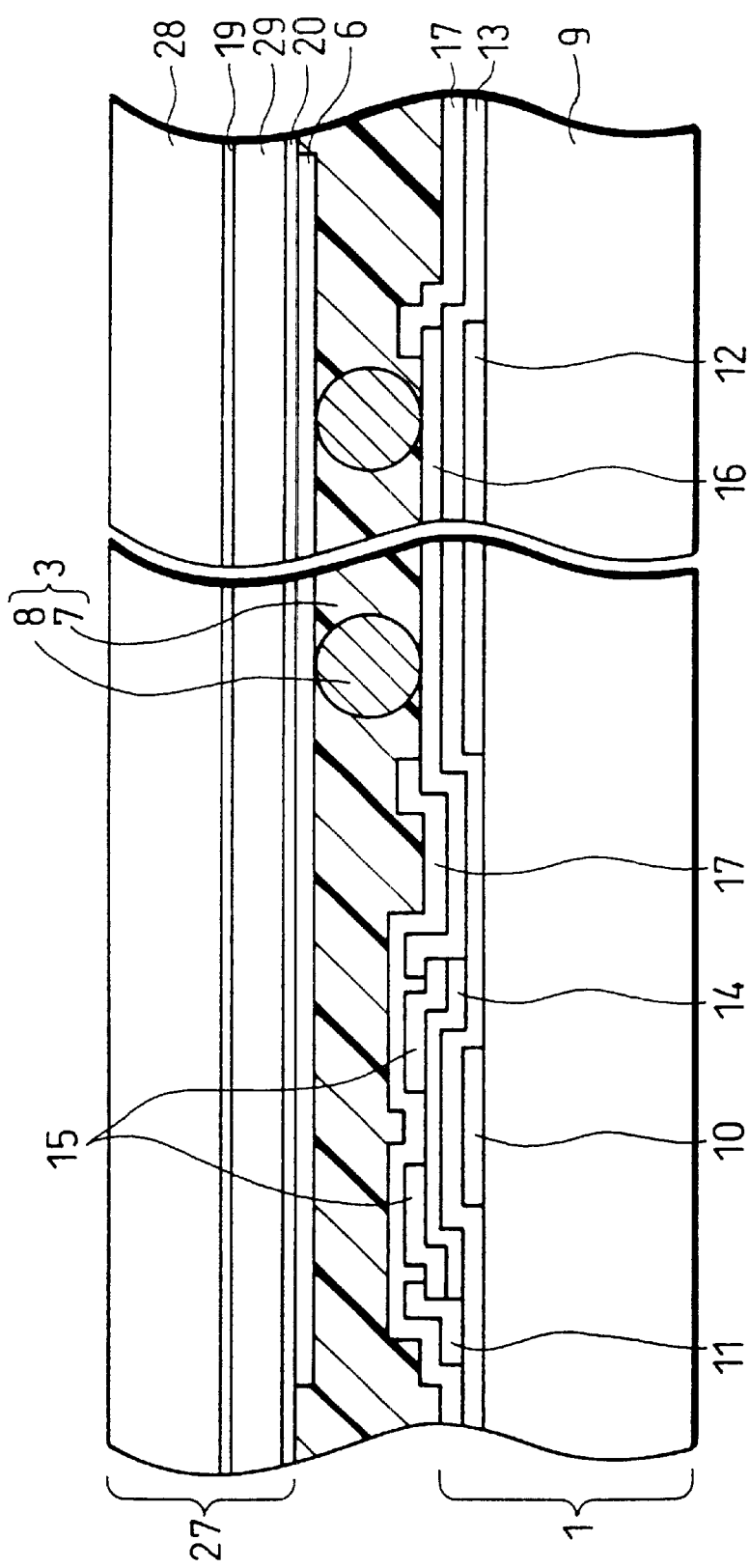
FIG. 6 is a sectional view showing the structure of each pixel of a two-dimensional image detector of still another embodiment of the present invention, using an opposing substrate having a structure different from that of the opposing substrate shown in FIG. 1.

The opposing substrate used in the two-dimensional image detector according to the present invention is not limited to the structure shown in FIG. 2, and an opposing substrate having another structure can be used. FIG. 6 shows the structure of a two-dimensional image detector including an opposing substrate 27 as another example of the structure of the opposing substrate. The structure of the opposing substrate 27 is similar to that of the opposing substrate 2 shown in FIG. 2. Therefore, the members having the same function as those shown in FIG. 2 will be designated by the same reference numbers, and their descriptions will be omitted.

As shown in FIG. 6, the opposing substrate 27 mainly includes a support substrate 28 and a semiconductor film (semiconductor layer) 29 to be deposited on the support substrate 28. The support substrate 28 must be a substrate having X-ray permeability, made of glass, ceramic, silicon, etc. A glass substrate having excellent permeability with respect to both X-rays and visible light, and a thickness ranging from about 0.7 to 1.1 mm is used here. Most X-rays at 40 to 100 keV can permeate the support substrate 28 like this.

Next, a top electrode 19 is formed by a metal such as Ti and Ag on one surface of the semiconductor substrate 18, particularly on the almost entire surface. When this two-dimensional image detector is used for detecting images by visible light, an ITO electrode which is transparent with respect to visible light is used as the top electrode 19.

Then, as a semiconductor film 29 on the top electrode 19, a polycrystalline film made of CdTe or CdZnTe is formed by the MOCVD method to have a thickness of about 0.5 mm. The MOCVD method is suitable for depositing the film on a large-area substrate. Here, the film deposition can be performed at a deposition temperature ranging from 400 to 500° C. by using the raw materials: organic cadmiums (dimethyl cadmium [DMCd], etc.), organic telluriums (diethyl tellurium [DETe], diisopropyl tellurium [DiPTe], etc.), organic zincs (diethyl zinc [DEZn], diisopropyl zinc [DiPZn], dimethyl zinc [DMZn], etc.).

On the top of the semiconductor film 29, a charge blocking layer 20 as a thin insulating layer made of $AlO_x$ is formed on the almost entire surface thereof. Then, a connection electrode 6 is formed by depositing a film of a metal such as Ta and Al to have a thickness of about 2000 Å, and patterning it to have a desired pattern. The connection electrode 6 is preferably formed at the position corresponding to the pixel electrode 16 formed on the active matrix substrate 1.

As in the first embodiment, the two-dimensional image detector in accordance with the present embodiment is completed by adhering the opposing substrate 27 arranged as above to the active matrix substrate 1 with an anisotropic conductive adhesive agent 3. This two-dimensional image detector operates on the same basic principle as that described in the first embodiment, though the structures of the opposing substrates are slightly different. Needless to say, it is also possible to arrange the opposing substrate 27 to be adhered to the active matrix substrate 22 in the second embodiment.

When the opposing substrate 27 having the above structure is used, since the semiconductor film 29 with photoconductivity is formed on the support substrate 28, the physical strength can be increased compared with the opposing substrate 2 described in the first embodiment. As a result, the opposing substrate 27 becomes less likely to crack when adhering the active matrix substrate 1 and the opposing substrate 27, thereby increasing the process margin.

When the use of this two-dimensional image detector is limited to detecting images by X-rays, it is also possible to use a X-ray permeable metal substrate, and make it function as the support substrate 28 and the top electrode 19.

Embodiment 4

Figure 7:
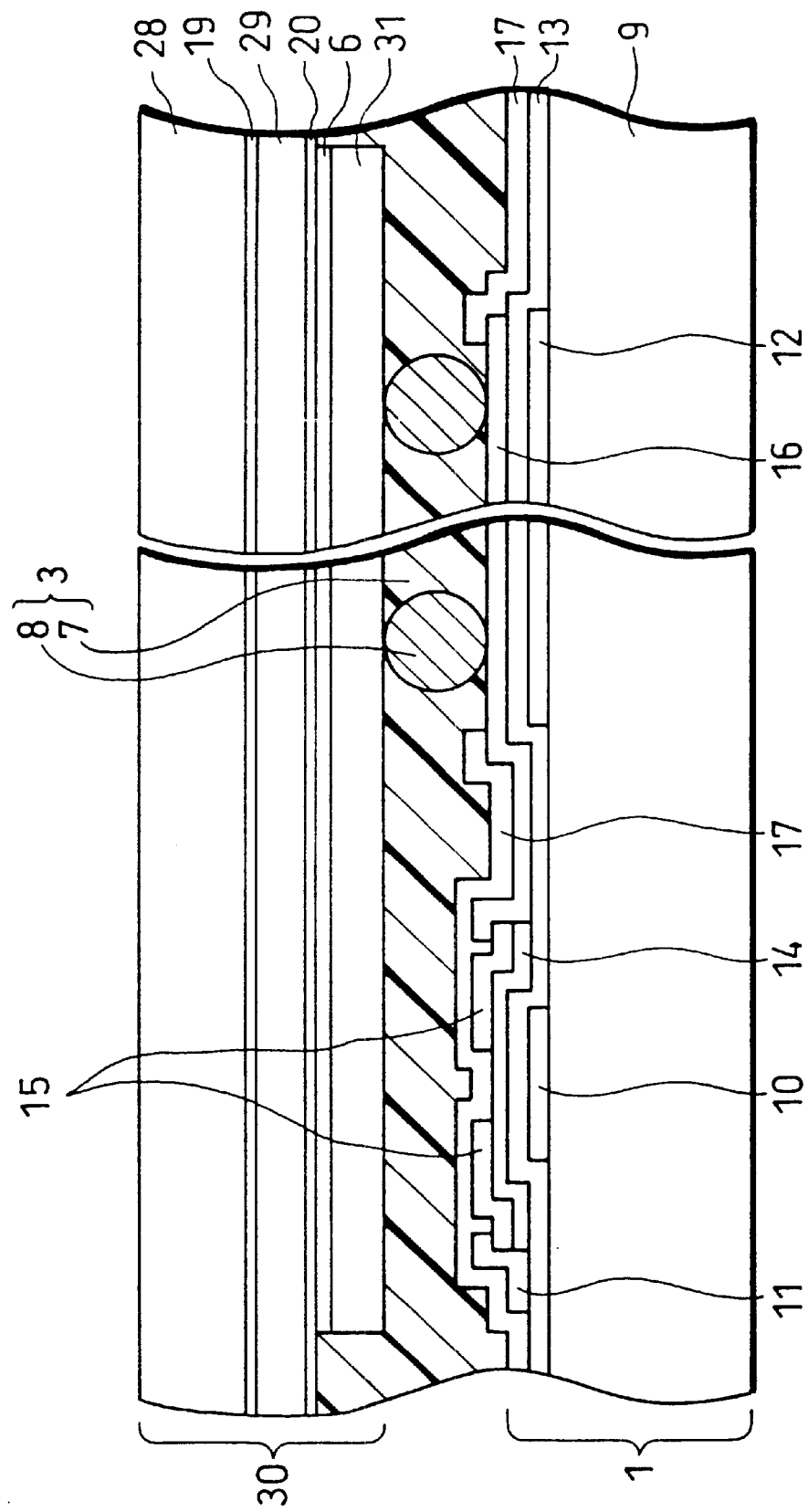
FIG. 7 is a sectional view showing the structure of each pixel of a two-dimensional image detector of yet another embodiment of the present invention, using an opposing substrate having a structure different from that of the opposing substrate shown in FIG. 1 or 6.

The opposing substrate used in the two-dimensional image detector according to the present invention is not limited to the structures shown in FIGS. 2 and 6, and an opposing substrate having another structure can be used. FIG. 7 shows the structure of a two-dimensional image detector including an opposing substrate 30 as another example of the structure of the opposing substrate. The structure of the opposing substrate 30 is similar to that of the opposing substrate 27 shown in FIG. 6. Therefore, the members having the same function as those shown in FIG. 6 will be designated by the same reference numbers and their descriptions will be omitted.

As shown in FIG. 7, the opposing substrate 30 has basically the same structure as the opposing substrate 27 shown in the third embodiment, and further includes a protrusion electrode 31 on a connection electrode 6. Namely, the protrusion electrode 31 is formed in correspondence with each of the plurality of pixel electrodes 16 on an active matrix substrate 1.

Specifically, after forming the connection electrode 6, the protrusion electrode 31 is formed on the connection electrode 6 by a metal such as Au, Cu, In, and solder, having a height ranging from a few micrometers to several tens micrometers, by the plating method or the stud bumping method. Alternatively, these metals may be laminated to form the protrusion electrode 31.

The protrusion electrode 31 may have other structures as below. Namely, the connection electrode 6 may be formed by the metals such as Au, Cu, In, and solder, having a height ranging from a few micrometers to several tens micrometers, or formed by laminating these metals, and arranged to function as the protrusion electrode 31. Alternatively, the protrusion electrode 31 can be formed as follows. Projections and depressions ranging from a few micrometers to several tens micrometers are formed at connection parts, i.e., locations where the connection electrodes 6 are to be formed, of the front surface (the surface facing the active matrix substrate 1) of the semiconductor film 29 made of CdTe, CdZnTe, etc. by photolithography or etching, and then the connection electrode 6 may be formed on the projection by the process shown in the third embodiment and arranged to function as the protrusion electrode 31.

As in the first embodiment, the two-dimensional image detector according to the present embodiment is completed by adhering the opposing substrate 30 including the protrusion electrode 31 arranged as above to the active matrix substrate 1 with an anisotropic conductive adhesive agent 3.

In this two-dimensional image detector having the above structure, when adhering the active matrix substrate 1 and the opposing substrate 30 with the anisotropic conductive adhesive agent 3, the pressure is concentrated on the protrusion electrode 31. Therefore, the pressure required in this adhesive connection can be reduced. In addition, since the excessive adhesive agent and small bubbles produced during the adhesive connection can escape into gaps (groove sections) between the protrusion electrodes 31, an electrode connection with high yield and high reliability can be achieved.

In this fourth embodiment, as the opposing substrate 30, for example, a structure in which the protrusion electrodes 31 are formed on the opposing substrate 27 shown in the third embodiment is illustrated. However, other arrangements of the opposing substrate 30 are acceptable. For example, a structure in which the protrusion electrodes 31 are formed on the opposing substrate 2 shown in the first embodiment may be used. In addition, the protrusion electrode 31 may be formed on the pixel electrode 16 of the active matrix substrate 1, and this arrangement can achieve the same effect as the above-mentioned example.

In the first to fourth embodiments, explanations are made mainly on the two-dimensional image detector for detecting images by X-rays (radiation). However, when the semiconductor (the semiconductor substrate 18 or the semiconductor film 29) to be used shows photoconductivity with respect to visible light and infrared light as well as radiation such as X-rays, the two-dimensional image detector can be also used for detecting images by visible light and infrared light. In this case, as the top electrode 19 disposed on the light-incident side of the semiconductor, a transparent electrode made of ITO, etc., which visible light and infrared light can permeate, is used. Furthermore, it is preferable that the thickness of the semiconductor is optimized in accordance with the absorption efficiency of visible light and infrared light.

In the first to fourth embodiments, the TFT 5 is used as the switching element for use in the active matrix substrate 1 (or the active matrix substrate 22). Other elements available here as the switching element are a two-terminal element such as a MIM (Metal-Insulator-Metal) and a varistor, and a switching element produced by combining diodes such as a diode ring and a back-to-back diode.

The basic structure of the present invention is such that the active matrix substrate and the photoconductor layer are formed on different substrates and then adhered to each other. Therefore, in addition to the above-mentioned effects, the present invention produces such an effect that overall yield is improved compared with the structure where the photoconductor layer is directly formed on the active matrix substrate. The reason for this is as follows. In the conventional structure where the photoconductor layer is directly laminated on the active matrix substrate, when a deficiency exists in the photoconductor layer, the active matrix substrate below the photoconductor layer is wasted. In contrast, in the present invention, the active matrix substrate and the opposing substrate, having no deficiencies, can be chosen and combined.

Therefore, the present invention is not limited to the two-dimensional image detector using the above-mentioned photoconductor material and sensor structure, and can be applied to a two-dimensional image detector using another photoconductor material and sensor structure. For example, in the first to fourth embodiments, polycrystal like CdTe and CdZnTe having excellent sensitivity to X-rays is used as the photoconductor layer, but other semiconductor materials such as a-Se and a-Si can be used as the photoconductor layer. In addition, the opposing substrate may be arranged to use a combination of a conversion layer (for example, CsI) for converting X-rays to visible light and a visible-light sensor.

As described so far, the two-dimensional image detector of the present invention is based on a two-dimensional image detector including:

a pixel array layer having electrode wiring provided in a lattice-like arrangement; a plurality of switching elements provided in lattice points; and charge storage capacitors including pixel electrodes connected to the electrode wiring through the switching elements;

an electrode section formed so as to face almost entire surface of the pixel array layer; and a semiconductor layer having photoconductivity, formed between the pixel array layer and the electrode section, and arranged to further include:

an active matrix substrate having the pixel array layer; and an opposing substrate having the electrode section and the semiconductor layer, wherein the active matrix substrate and the opposing substrate are disposed so that the pixel array layer of the active matrix substrate faces the semiconductor layer of the opposing substrate, and connected to each other with an anisotropic conductive material having conductivity in only a direction normal to a surface of the pixel array layer or the semiconductor layer, where the pixel array layer faces the semiconductor layer.

In addition, the semiconductor layer is preferably arranged to have sensitivity to radiation.

Furthermore, the semiconductor layer is preferably made of a compound semiconductor represented by CdTe or CdZnTe.

Moreover, in the two-dimensional image detector, the anisotropic conductive material is preferably an anisotropic conductive adhesive agent produced by dispersing conductive particles in an insulating adhesive agent.

Since the two-dimensional image detector is arranged so that the active matrix substrate including the pixel array layer is connected to the opposing substrate including the electrode section and the semiconductor layer with the anisotropic conductive material, the active matrix substrate and the opposing substrate can be produced individually. It is thus possible to use, for the semiconductor layer, the material which could not be conventionally used because of the relation between the film deposition temperature of the semiconductor layer and the heat resistance of the switching element on the active matrix substrate. In addition, by arranging the semiconductor layer to have sensitivity to radiation, the two-dimensional image detector for detecting the radiation image can be realized.

In particular, by using for the semiconductor layer the compound semiconductor like CdTe or CdZnTe having higher sensitivity (S/N ratio) to radiation such as X-rays than a-Se used conventionally, it is possible to improve the response of the two-dimensional image detector compared with the conventional one.

In this case, the voltage applied to the electrode section can be set lower than the conventional value. It is thus possible to omit the dielectric layer which were conventionally provided between the semiconductor layer and the electrode section for protection from the high voltage. Since the conventional structure where the dielectric layer is provided between the semiconductor layer and the electrode section requires a sequence for removing the charges remaining in the dielectric layer every frame, only static images can be detected. However, since the two-dimensional image detector of the present invention can omit the dielectric layer, dynamic images can be detected as well.

In addition, the two substrates, i.e., the active matrix substrate and the opposing substrate are connected to each other with the anisotropic conductive material. Therefore, the pixels of the active matrix substrate are electrically insulated from each other, and the pixel electrodes on the active matrix substrate and the semiconductor layer of the opposing substrate can be electrically and physically connected to each other without causing crosstalk between the adjacent pixels.

As the anisotropic conductive material, the anisotropic conductive adhesive agent produced by dispersing the conductive particles in the insulating adhesive agent can be used. When using the anisotropic conductive adhesive agent, for example, by filling the anisotropic conductive adhesive agent between the upper and lower substrates and pressing the substrates so as to adhere the two substrates, the two facing substrates can be brought into conduction by the conductive particles, and the adjacent electrodes can be insulated from each other. It is thus possible to obtain satisfactory anisotropic conduction characteristics.

In addition, a paste-form adhesive agent can be used as the anisotropic conductive adhesive agent. This adhesive agent can be easily applied to even a large-area substrate by the screen printing method, etc.

A film-form adhesive agent can be also used as the anisotropic conductive adhesive agent. With the use of the film-form adhesive agent having excellent uniformity in thickness as the anisotropic conductive adhesive agent, a uniform thickness of the adhesive agent can be easily realized even when adhering the large-area substrates.

Furthermore, by using a thermosetting-type adhesive agent with excellent reliability in the heat resistance, the adhesive property, etc. as the anisotropic conductive adhesive agent, a highly-reliable two-dimensional image detector can be realized.

A thermoplastic-type adhesive agent can be also used as the anisotropic conductive adhesive agent. The use of the thermoplastic-type adhesive agent as the anisotropic conductive adhesive agent produces the following effect. Namely, when a deficiency is found in either the active matrix substrate or the opposing substrate after the two substrates are adhered by performing the heat treatment, the substrates once adhered can be separated by softening the adhesive agent by performing the heat treatment again. In addition, reworking can be easily performed.

In addition, a photo-curing-type adhesive agent can be used as the anisotropic conductive adhesive agent. In this case, the pixel electrode is preferably a transparent electrode. Since the photo-curing-type agent is used as the anisotropic conductive adhesive agent, no heat treatment is required when adhering the two substrates, i.e., the active matrix substrate and the opposing substrate. Therefore, when adhering the active matrix substrate and the opposing substrate having relatively large areas, even if the two substrates have different thermal expansion coefficients, no heat treatment is necessary. Therefore, warpage of the substrates and separation of adhered surfaces are not caused by the difference in the degree of thermal expansion.

In this case, when the pixel electrode is the transparent electrode, the photo-curing-type anisotropic conductive adhesive agent can be irradiated with light incident from the active matrix substrate side through the pixel electrode.

It is preferred that a plurality of connection electrodes are formed on the surface of the semiconductor layer of the opposing substrate in correspondence with a plurality of pixel electrodes formed on the active matrix substrate.

With this arrangement, the pixels of the semiconductor on the opposing substrate are electrically separated from each other by the plurality of connection electrodes in correspondence with the plurality of pixel electrodes formed on the active matrix substrate. Therefore, the charges generated in the semiconductor by incidence of radiation and light beams are collected by only the connection electrode corresponding to the incidence location, and the charges do not move to the surrounding pixels. As a result, the electrical crosstalk is prevented.

It is preferable that each pixel electrode has a smaller area than the connection electrode. By forming the connection electrode having a maximum size within each pixel on the semiconductor layer side of the opposing substrate, the charges generated in the semiconductor by incidence of X-rays and light beams can be efficiently collected. At the same time, by forming the pixel electrode of the active matrix substrate side to have a smaller size than the connection electrode, even if the active matrix substrate and the opposing substrate are not accurately aligned when adhering the two substrates, the electric crosstalk between the adjacent pixels can be prevented.

A plurality of protrusion electrodes may be formed on the connection surface of at least one of the active matrix substrate and the opposing substrate in correspondence with a plurality of pixel electrodes formed on the active matrix substrate.

With this arrangement, when adhering the active matrix substrate and the opposing substrate with the anisotropic conductive material, the pressure is concentrated on the protrusion electrodes. Therefore, the pressure required to be applied in the adhesive connection of the two substrates can be reduced. In addition, the gap between the protrusion electrodes can be secured as the space into which the excessive adhesive agent or the bubbles produced in adhering the substrates can escape. As a result, an electrode connection with high yield and high reliability can be achieved.

Furthermore, by arranging the semiconductor layer having photoconductivity function as the support substrate in the opposing substrate, a crystalline semiconductor substrate obtained by the Bridgeman method, the gradient freezing method, the travel heating method, etc. can be used as the semiconductor layer.

The opposing substrate can be also arranged so that a substrate which light and radiation to be detected can permeate is provided as the support substrate, and the semiconductor layer having photoconductivity is formed on the support substrate. Since the opposing substrate is arranged to include the substrate which light and radiation to be detected can permeate as the support substrate, and the semiconductor layer with photoconductivity formed on the support substrate, the strength of the opposing substrate can be increased.

Meanwhile, as described above, a process for manufacturing a two-dimensional image detector of the present invention is based on a process for manufacturing a two-dimensional image detector including:

a pixel array layer having electrode wiring provided in a lattice-like arrangement; a plurality of switching elements provided in lattice points; and charge storage capacitors including pixel electrodes connected to the electrode wiring through the switching elements;

an electrode section formed so as to face almost entire surface of the pixel array layer; and a semiconductor layer having photoconductivity, formed between the pixel array layer and the electrode section, and includes the steps of:

(1) producing an active matrix substrate including the pixel array layer;
(2) producing an opposing substrate including the electrode section and the semiconductor layer;
(3) connecting the active matrix substrate to the opposing substrate with an anisotropic conductive material having conductivity in a direction normal to a surface of the pixel array layer or the semiconductor layer, where the pixel array layer faces the semiconductor layer, so that the pixel array layer of the active matrix substrate faces the semiconductor layer of the opposing substrate.

In this manner, the active matrix substrate including the pixel array layer is produced in the first step, and the opposing substrate including the electrode section and the semiconductor layer is produced in the second step. The individually produced substrates are then connected to each other with the anisotropic conductive material in the third step. Therefore, unlike the conventional process, it is unnecessary to newly form the semiconductor layer on the substrate where the pixel array layer is already formed. As a result, the material which could not be conventionally used, for example, the compound semiconductor like CdTe or CdZnTe can be used for the semiconductor layer.

Since the above semiconductor material has higher sensitivity (S/N ratio) to radiation such as X-rays than a-Se which was conventionally used, when the compound semiconductor like CdTe or CdZnTe is used for the semiconductor layer, the response of the two-dimensional image detector can be improved, and dynamic images can be detected as well.

In the third step, the anisotropic conductive adhesive agent including the conductive particles dispersed in the adhesive agent is used as the anisotropic conductive material, and after applying or transferring this anisotropic conductive adhesive agent to the surface of at least one of the active matrix substrate and the opposing substrate, the two substrates are adhered to each other.

In this manner, the anisotropic conductive adhesive agent is used as the anisotropic conductive material, and the active matrix substrate and the opposing substrate are adhered with the anisotropic conductive adhesive agent. Consequently, even when adhering the active matrix substrate and the opposing substrate having the large areas, the anisotropic conductive adhesive agent can be easily applied or transferred, and thus the two substrates can be easily adhered to each other.

The anisotropic conductive adhesive agent is applied or transferred to have a thickness substantially equal to the diameter of the conductive particle. Therefore, even when adhering substantially-flat surfaces of the substrates, it is possible to minimize the flow of the excessive adhesive agent and to obtain satisfactory anisotropic conductivity.

In the third step, the thermosetting-type anisotropic conductive adhesive agent or the thermoplastic-type anisotropic conductive adhesive agent is used as the anisotropic conductive adhesive agent, and the active matrix substrate and the opposing substrate are adhered to each other by passing them between the heat rollers.

Therefore, even when adhering the active matrix substrate and the opposing substrate having the large areas, the press force is not required to be applied to the entire surface of the substrate. Thus, the large-scale hydraulic press device, etc. are not required, and a relatively small-scale press device can be used. As a result, the step of adhering the two substrates and the devices used in the adhering step can be simplified.

In the third step, the thermosetting-type anisotropic conductive adhesive agent or the thermoplastic-type anisotropic conductive adhesive agent can be used as the anisotropic conductive adhesive agent, and the active matrix substrate and the opposing substrate can be adhered to each other by thermocompression bonding using the press device.

Since the two substrates can be adhered to each other by thermocompression bonding using the press device, a general thermal press device can be used in the step of adhering the substrates.

In addition, the press device can be replaced by the autoclave device. Therefore, even when adhering the active matrix substrate and the opposing substrate having the large areas, a uniform pressure can be obtained.

In the third step, the photo-curing-type anisotropic conductive adhesive agent can be used as the anisotropic conductive adhesive agent, and the active matrix substrate and the opposing substrate can be brought into contact with and then adhered to each other by irradiation of light from the active matrix substrate.

Therefore, for example, by forming the pixel electrode of the active matrix substrate by the transparent electrode, and irradiating the adhesive agent with light from the active matrix substrate side, the active matrix substrate and the opposing substrate can be adhered to each other without requiring heat treatment. As a result, when adhering the substrates having relatively large areas, if the thermal expansion coefficients of the two substrates are different, warpage of the substrates and separation of adhered surfaces are not caused by the difference in the degree of thermal expansion due to the heat treatment.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A two-dimensional image detector comprising:

an active matrix substrate including switching elements and charge storage capacitors having respective pixel electrodes connected to the switching elements;

an opposing substrate including an electrode layer and a semiconductor layer having photoconductivity, said active matrix substrate and said opposing substrate being disposed so that the charge storage capacitors face the semiconductor layer;

a connection layer, disposed between said substrates, for connecting said substrates to each other; and wherein said connection layer has conductivity in only a direction normal to a surface of the charge storage capacitor or the semiconductor layer, where the charge storage capacitor faces the semiconductor layer.

2. The two-dimensional image detector as set forth in claim 1, wherein said semiconductor layer is made of a crystalline or polycrystalline material, and has excellent sensitivity to X-rays.

3. The two-dimensional image detector as set forth in claim 2, wherein said semiconductor layer is made of a compound semiconductor represented by CdTe or CdZnTe.

4. The two-dimensional image detector as set forth in claim 1, wherein said opposing substrate includes connection electrodes on the semiconductor layer, and each of said connection electrodes is located so as to face the pixel electrode of said active matrix substrate.

5. The two-dimensional image detector as set forth in claim 4, wherein the pixel electrode has a smaller area than the connection electrode.

6. The two-dimensional image detector as set forth in claim 1, wherein said opposing substrate includes a charge blocking layer on said semiconductor layer, for blocking a flow of charges from one surface of said charge blocking layer.

7. The two-dimensional image detector as set forth in claim 6, wherein said opposing substrate includes connection electrodes on said charge blocking layer, and each of said connection electrodes is located so as to face the pixel electrode of said active matrix substrate.

8. The two-dimensional image detector as set forth in claim 1, wherein said opposing substrate includes a charge blocking layer between the electrode layer and the semiconductor layer.

9. The two-dimensional image detector as set forth in claim 1, wherein said connection layer includes an insulating adhesive agent and conductive particles dispersed in said adhesive agent, and has anisotropic conductivity.

10. The two-dimensional image detector as set forth in claim 9, wherein said adhesive agent has a thermosetting property.

11. The two-dimensional image detector as set forth in claim 9, wherein said adhesive agent has thermoplasticity.

12. The two-dimensional image detector as set forth in claim 9, wherein said adhesive agent has a photo-curing property.

13. The two-dimensional image detector as set forth in claim 9, wherein said connection layer is in a paste form.

14. The two-dimensional image detector as set forth in claim 9, wherein said connection layer is in a film form.

15. The two-dimensional image detector as set forth in claim 1, wherein said semiconductor layer is also used as a support substrate of said opposing substrate.

16. The two-dimensional image detector as set forth in claim 4, wherein protrusion electrodes are provided on said connection electrodes so that each of said protrusion electrodes corresponds to said pixel electrode.

17. The two-dimensional image detector as set forth in claim 7, wherein protrusion electrodes are provided on said connection electrodes so that each of said protrusion electrodes corresponds to said pixel electrode.

18. The two-dimensional image detector as set forth in claim 1, wherein protrusion electrodes are provided on said pixel electrodes.

19. The two-dimensional image detector as set forth in claim 1, wherein said semiconductor layer has photoconductivity with respect to radiation.

20. The two-dimensional image detector as set forth in claim 1, wherein said semiconductor layer has photoconductivity with respect to visible light or infrared light, and permeability with respect to visible light or infrared light.

21. A process for manufacturing a two-dimensional image detector, comprising the steps of:

(a) preparing an active matrix substrate including switching elements and charge storage capacitors having pixel electrodes;

(b) preparing an opposing substrate including an electrode layer and a semiconductor layer showing photoconductivity; and (c) adhering said active matrix substrate and said opposing substrate to each other with a connection layer having anisotropic conductivity.

22. The process for manufacturing the two-dimensional image detector as set forth in claim 21, wherein, in said step (c), an anisotropic conductive adhesive agent including conductive particles dispersed in an adhesive agent is used as said connection layer, and applied or transferred to either said active matrix substrate or said opposing substrate.

23. The process for manufacturing the two-dimensional image detector as set forth in claim 22,
wherein, in said step (c), said anisotropic conductive adhesive agent is applied or transferred to have a thickness substantially equal to a diameter of said conductive particle.

24. The process for manufacturing the two-dimensional image detector as set forth in claim 22,
wherein, in said step (c), a thermosetting-type or thermoplastic-type anisotropic conductive adhesive agent is used as said anisotropic conductive adhesive agent, and
said active matrix substrate and said opposing substrate which are disposed so as to face each other are passed between a pair of heat rollers, and adhered to each other by heat and pressure.

25. The process for manufacturing the two-dimensional image detector as set forth in claim 22,
wherein, in said step (c), a thermosetting-type or thermoplastic-type anisotropic conductive adhesive agent is used as said anisotropic conductive adhesive agent, and
said active matrix substrate and said opposing substrate which are disposed so as to face each other are adhered to each other by thermocompression bonding by using a press device.

26. The process for manufacturing the two-dimensional image detector as set forth in claim 25,
wherein said press device is an autoclave device.

27. The process for manufacturing the two-dimensional image detector as set forth in claim 22,
wherein, in said step (c), a photo-curing-type anisotropic conductive adhesive agent is used as said anisotropic conductive adhesive agent, and
light is irradiated from said active matrix substrate side in a state in which said active matrix substrate and said opposing substrate are adhered to each other.

28. The process for manufacturing the two-dimensional image detector as set forth in claim 21,
wherein said step (a) includes the steps of:
(d) forming gate electrode wiring, source electrode wiring, said switching elements, and electrodes of said charge storage capacitors;
(e) forming an insulating protective film for substantially entirely coating said gate electrode wiring, said source electrode wiring, said switching elements, and said electrodes of said charge storage capacitors;
(f) forming a throughhole at a specific location of said insulating protective film; and
(g) forming pixel electrodes on said insulating protective film.

29. The process for manufacturing the two-dimensional image detector as set forth in claim 21,
wherein said step (b) includes the steps of:
(h) forming said semiconductor layer on said electrode layer;
(i) forming on said semiconductor layer a charge blocking layer for blocking intrusion of charges from one surface of said charge blocking layer; and
(j) forming, connection electrodes on said charge blocking layer so as to correspond to said pixel electrodes of said active matrix substrate.

30. The two-dimensional image detector as set forth in claim 29, further comprising the step of forming said electrode layer on a support substrate having permeability with respect to radiation or light before said step (h).

31. The two-dimensional image detector as set forth in claim 29, further comprising the step of forming protrusion electrode s on said connection electrodes so as to correspond to said pixel electrodes of said active matrix substrate after said step (j).

32. A two-dimensional image detector comprising:
an active matrix substrate including switching elements and charge storage capacitors having respective pixel electrodes connected to the switching elements;
an opposing substrate including an electrode layer and a semiconductor layer having photoconductivity, said active matrix substrate and said opposing substrate being disposed so that the charge storage capacitors face the semiconductor layer;
a connection layer, disposed between said substrates, for connecting said substrates to each other; and
wherein said active matrix substrate includes gate electrode wiring and source electrode wiring, and wherein the gate electrode wiring, the source electrode wiring and the switching elements are substantially entirely coated with an insulating protective film.

33. The two-dimensional image detector as set forth in claim 32, wherein said semiconductor layer is made of a crystalline or polycrystalline material, and has excellent sensitivity to X-rays.

34. The two-dimensional image detector as set forth in claim 33, wherein said semiconductor layer is made of a compound semiconductor represented by CdTe or CdZnTe.

35. The two-dimensional image detector as set forth in claim 32, wherein said opposing substrate includes connection electrodes on the semiconductor layer, and each of said connection electrodes is located so as to face a corresponding pixel electrode of said active matrix substrate.

36. The two-dimensional image detector as set forth in claim 35, wherein the pixel electrode has a smaller area than the connection electrode.

37. The two-dimensional image detector as set forth in claim 32, wherein said opposing substrate includes a charge blocking layer on said semiconductor layer, for blocking a flow of charges from one surface of said charge blocking layer.

38. The two-dimensional image detector as set forth in claim 37, wherein said opposing substrate includes connection electrodes on said charge blocking layer, and each of said connection electrodes is located so as to face the pixel electrode of said active matrix substrate.

39. The two-dimensional image detector as set forth in claim 32, wherein said opposing substrate includes a charge blocking layer between the electrode layer and the semiconductor layer.

40. The two-dimensional image detector as set forth in claim 32, wherein said semiconductor layer is also used as a support substrate of said opposing substrate.

41. The two-dimensional image detector as set forth in claim 35, wherein protrusion electrodes are provided on said connection electrodes so that each of said protrusion electrodes corresponds to said pixel electrode.

42. The two-dimensional image detector as set forth in claim 38, wherein protrusion electrodes are provided on said connection electrodes so that each of said protrusion electrodes corresponds to said pixel electrode.

43. The two-dimensional image detector as set forth in claim 32, wherein protrusion electrodes are provided on said pixel electrodes.

44. The two-dimensional image detector as set forth in claim 32, wherein said semiconductor layer has photoconductivity with respect to radiation.

45. The two-dimensional image detector as set forth in claim 32, wherein said semiconductor layer has photoconductivity with respect to visible light or infrared light, and permeability with respect to visible light or infrared light.

46. A two-dimensional image detector comprising:
- an active matrix substrate including switching elements and charge storage capacitor having pixel electrodes connected to the switching elements;
- opposing substrate including an electrode layer, a support substrate that is permeable to x-ray or light, and a semiconductor layer having photoconductivity;
- wherein said active matrix substrate and said opposing substrate are disposed so that the charge storage copacitors face the semiconductor layer;
- a connection layer, disposed between said substrates, for connecting said substrates to each other; and
- wherein for said opposing substrate said electrode contacts and is located directly between (i) support substrate having permeability to x-rays or light, and (ii) said semiconductor layer, and wherein said semiconductor layer is on the side of said electrode closest to said active substrate.

47. The two-dimensional image detector as set forth in claim 46, wherein said semiconductor layer is made of a crystalline or polycrystalline material, and has excellent sensitivity to X-rays.

48. The two-dimensional image detector as set forth in claim 47, wherein said semiconductor layer is made of a compound semiconductor represented by CdTe or CdZnTe.

49. The two-dimensional image detector as set forth in claim 46, wherein said opposing substrate includes connection electrodes on the semiconductor layer, and each of said connection electrodes is located so as to face a corresponding pixel electrode of said active matrix substrate.

50. The two-dimensional image detector as set forth in claim 49, wherein the pixel electrode has a smaller area than the connection electrode.

51. The two-dimensional image detector as set forth in claim 46, wherein said opposing substrate includes a charge blocking layer on said semiconductor layer, for blocking a flow of charges from one surface of said charge blocking layer.

52. The two-dimensional image detector as set forth in claim 51, wherein said opposing substrate includes connection electrodes on said charge blocking layer, and each of said connection electrodes is located so as to face the pixel electrode of said active matrix substrate.

53. The two-dimensional image detector as set forth in claim 46, wherein said opposing substrate includes a charge blocking layer between the electrode layer and the semiconductor layer.

54. The two-dimensional image detector as set forth in claim 49, wherein protrusion electrodes are provided on said connection electrodes so that each of said protrusion electrodes corresponds to said pixel electrode.

55. The two-dimensional image detector as set forth in claim 52, wherein protrusion electrodes are provided on said connection electrodes so that each of said protrusion electrodes corresponds to said pixel electrode.

56. The two-dimensional image detector as set forth in claim 46, wherein protrusion electrodes are provided on said pixel electrodes.

57. The two-dimensional image detector as set forth in claim 46, wherein said semiconductor layer has photoconductivity with respect to radiation.

58. The two-dimensional image detector as set forth in claim 46, wherein said semiconductor layer has photoconductivity with respect to visible light or infrared light, and permeability with respect to visible light or infrared light.

59. The two-dimensional image detector as set forth in claim 32,
- wherein said pixel electrodes are disposed on the insulating protective film.

* * * * *